United States Patent
Choi

(10) Patent No.: US 7,030,655 B2
(45) Date of Patent: Apr. 18, 2006

(54) MEMORY INTERFACE SYSTEM

(75) Inventor: Jung-Hwan Choi, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 75 days.

(21) Appl. No.: 10/645,922

(22) Filed: Aug. 20, 2003

(65) Prior Publication Data

US 2004/0207544 A1    Oct. 21, 2004

(30) Foreign Application Priority Data

Apr. 18, 2003    (KR) ................. 10-2003-0024781

(51) Int. Cl.
*H03K 19/094* (2006.01)
(52) U.S. Cl. .................. 326/86; 326/82; 326/105; 326/90
(58) Field of Classification Search ........ 326/104–108, 326/82–83, 86, 90
See application file for complete search history.

(56) References Cited

U.S. PATENT DOCUMENTS

| | | | |
|---|---|---|---|
| 5,864,584 A | 1/1999 | Cao et al. | |
| 6,184,714 B1 | 2/2001 | Kirech et al. | |
| 6,211,698 B1 | 4/2001 | Suh | |
| 6,275,067 B1 | 8/2001 | Kirsch et al. | |
| 6,300,795 B1 | 10/2001 | Kirech et al. | |
| 6,320,417 B1 | 11/2001 | Kirech et al. | |
| 6,396,329 B1* | 5/2002 | Zerbe | ..................... 327/336 |
| 6,437,713 B1* | 8/2002 | Lesea | ..................... 341/78 |
| 6,703,866 B1* | 3/2004 | Arimilli et al. | ............. 326/86 |
| 2002/0140592 A1 | 10/2002 | Nguyen | |

OTHER PUBLICATIONS

Von F. Kuhne, "Modulation and Demodulation Von QAM-Signalen in Digital-Richtfunksystemen", Modulation and demodulation of QAM-Signals in Digital Radio Systems, Frequenz, Schiele und Schon Gmbh. Berlin De, vol. 37, No. 5, May 1983, XP-000763711, pp. 117-122.

* cited by examiner

*Primary Examiner*—Anh Q. Tran
(74) *Attorney, Agent, or Firm*—Marger Johnson & McCollom, P.C.

(57) ABSTRACT

The invention relates to a semiconductor memory device and, more particularly, to an interface system for a semiconductor memory device. The interface includes a transmitter capable of encoding first and second input signals as a plural-bit symbol signal responsive to first and second clocks, respectively, the first clock being out of phase from the second clock. And the interface includes a receiver capable of generating first and second output signals by decoding the symbol signal responsive to third and fourth clocks, respectively. Other embodiments are illustrated and described.

25 Claims, 11 Drawing Sheets

MEMORY INTERFACE SYSTEM

This application claims priority from Korean patent application No. 03-24781 filed Apr. 18, 2003 that we incorporate herein by reference.

BACKGROUND OF THE INVENTION

1. Field of the Invention

The invention relates to a semiconductor memory device and, more particularly, to an interface system for a semiconductor memory device.

2. Description of the Related Art

A bus is typically used when two or more signals are routed in parallel over significant distances. The bus will often contain two wires per signal resulting in transmission of a differential signal. The differential signal improves bus speed. Several developments, however, work to adversely affect bus speed. Among them is increased line delay due to increases in line resistance resulting from reductions in line widths and elongations of line lengths. And line delays increase as the separation between differential lines decreases increasing line-to-line capacitance.

One way to improve bus speed is to encode digital data on multiple signal levels and transmit it on a single line. This and other approaches are described in several patents, including U.S. Pat. No. 6,211,698 to Suh and U.S. Pat. Nos. 6,275,067, 6,300,795, 6,320,417, all to Kirsch and others. In all of these cases, however, the devices described suffer from various disadvantages, including lack of implementation flexibility, reduced timing margins, and state discontinuities that lead to decreased speed and increased data errors.

Accordingly, a need remains for an improved interface system for a semiconductor memory device.

BRIEF DESCRIPTION OF THE DRAWINGS

The foregoing and other objects, features, and advantages of the invention will become more readily apparent from the detailed description of an embodiment that references the following drawings.

DETAILED DESCRIPTION OF THE PREFERRED EMBODIMENT

Figure 1A:
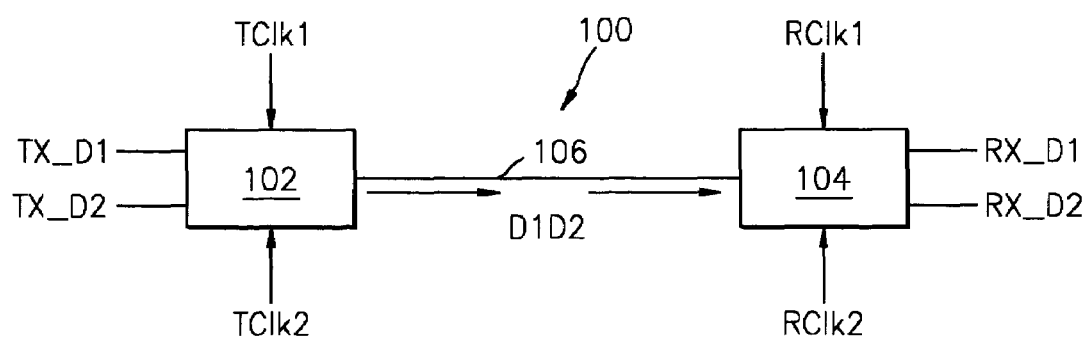
FIG. 1A is a block diagram of a memory interface embodiment.

FIG. 1A is a block diagram of an interface system according to an embodiment of the present invention. Referring to FIG. 1A, the interface system 100 includes a transmitter 102, a receiver 104, and a transmission line 106. The transmitter 102 receives input signals TX_D1 and TX_D2 and generates multiple bit symbol data D1D2 responsive to first and second transmit clocks TCLK1 and TCLK2, respectively.

The input signals TX_D1 and TX_D2 are, e.g., single bit or two level signals. The symbol data D1D2, on the other hand, is, e.g., a multiple bit or at least three level signal. In one embodiment, the symbol data D1D2 results from superpositioning the input signals TX_D1 and TX_D2. The symbol data D1D2 might, e.g., provide two data bits per bit time. By doing so, the interface 100 increases bandwidth.

In one embodiment, the bit time is half a period of an external clock. A person of reasonable skill in the art should recognize that the bit time might have different periods and vary according to a variety of internal or external clocks.

The transmission line 106 transmits the symbol data D1D2 to the receiver 104. The receiver 104 decodes the symbol data D1D2 to generate output signals RX_D1 and RX_D2 responsive to first and second receive clocks RCLK1 and RCLK2, respectively. The output signals RX_D1 and RX_D2 are, e.g., single bit signals.

Figure 1B:
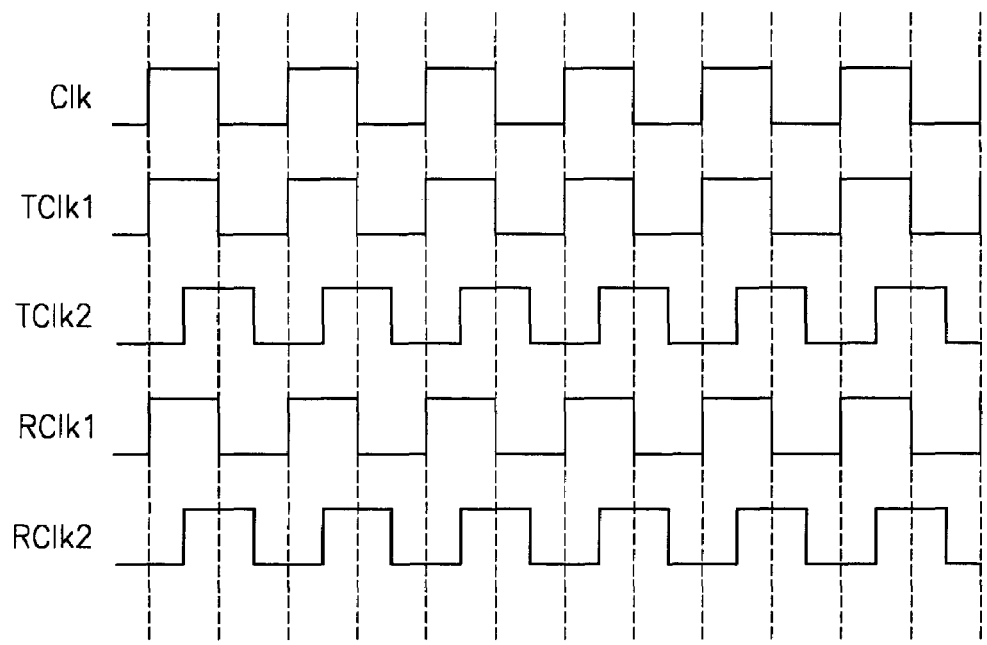
FIG. 1B is a timing diagram associated with memory interface embodiment shown in FIG. 1A.

FIG. 1B is a timing diagram of the invention embodiment shown in FIG. 1A. Referring to FIG. 1B, the first transmitter and receiver clocks TCLK1 and RCLK1 are synchronized with an external clock CLK. In one embodiment, the second transmitter and receiver clocks TCLK2 and RCLK2 are out of phase relative to the first transmitter and receiver clocks TCLK1 and RCLK1, e.g., 90 degrees out of phase.

Figure 2A:
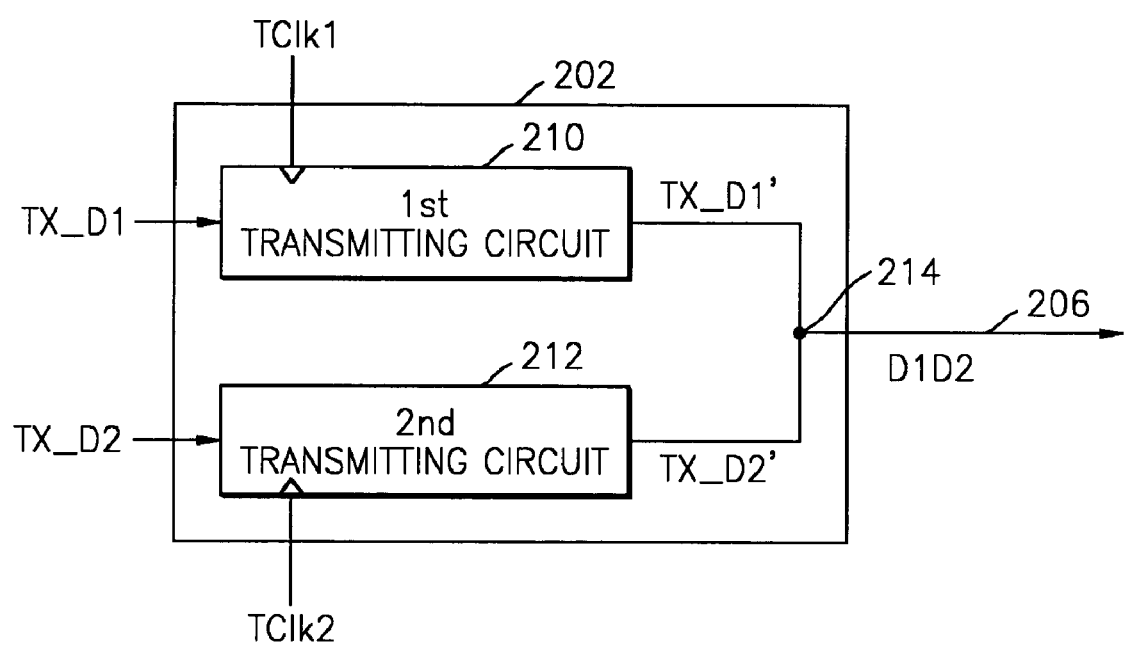
FIG. 2A is a block diagram of a transmitter embodiment.

FIG. 2A is a block diagram of an embodiment of the transmitter 102 shown in FIG. 1A. The transmitter 202 includes first and second transmitting circuits 210 and 212 coupled to a superposition node 214. The superposition node 214 is coupled to a transmission line 206. The first transmitting circuit 210 receives the first input signal TX_D1 and generates first transmit signal TX_D1' responsive to the first transmit clock TCLK1. Likewise, the second transmitting circuit 212 receives the second input signal TX_D2 and generates second transmit signal TX_D2' responsive to the second transmit clock TCLK2. The node 214 superpositions first and second transmit signals TX_D1' and TX_D2' to generate and provide the symbol data D1D2 to the transmission line 206. The operation and structure of the first and second transmitting circuits 210 and 212 is well known and disclosed in, e.g., U.S. Pat. No. 6,184,714 to Kirsch that is incorporated herein by reference.

In one embodiment, the input signals TX_D1 and TX_D2 are two level signals. In one embodiment, the symbol data D1D2 is at least a three level signal. This means that the symbol data D1D2 uses at least three voltage levels, e.g., high voltage level H, low voltage level L, and medium voltage level M, to indicate a data state. In one embodiment, the medium voltage level M is an arithmetic average of the high and low voltage levels H and L, respectively.

Figure 2B:
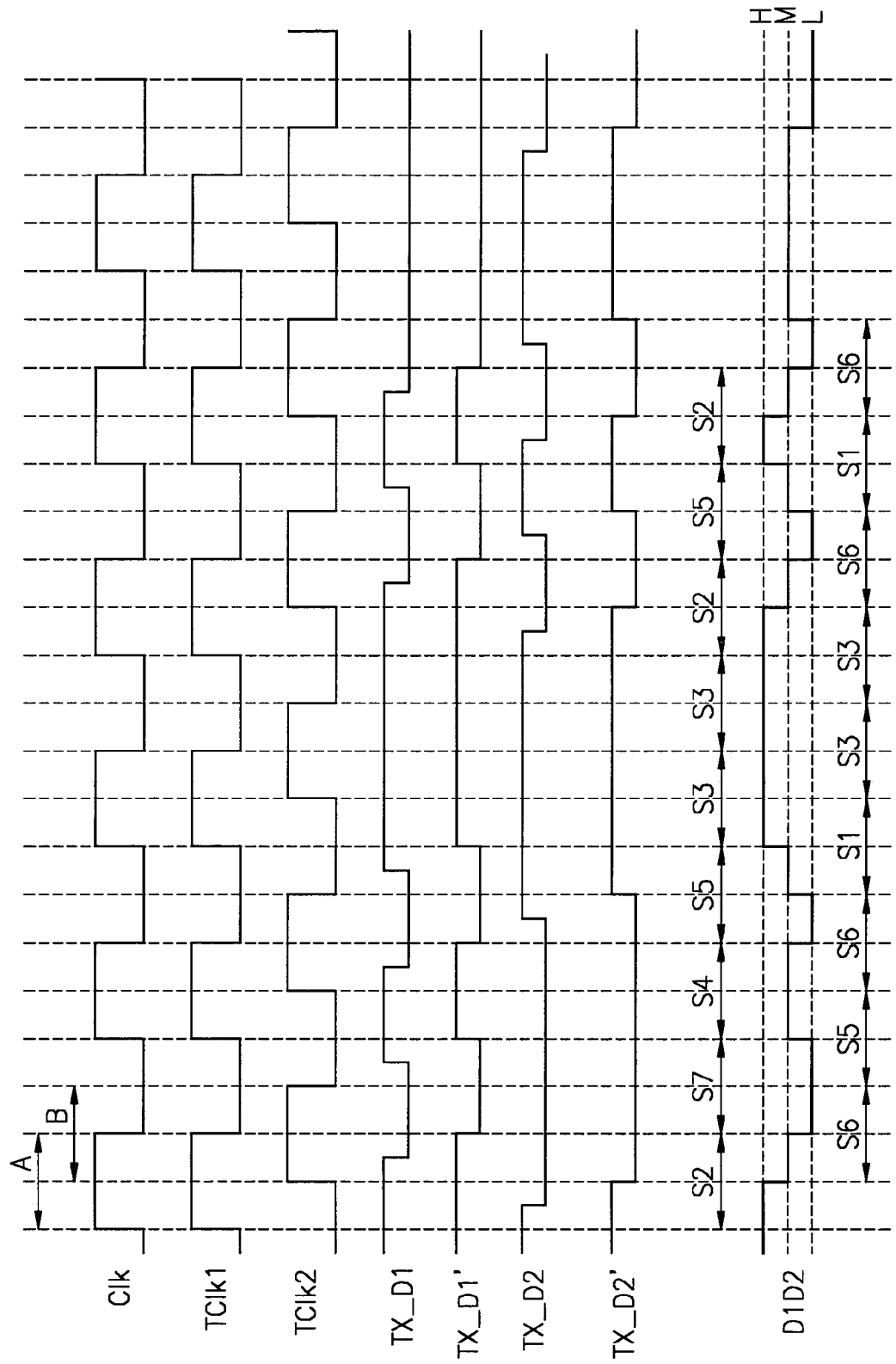
FIG. 2B is a timing diagram associated with the transmitter shown in FIG. 2A.

FIG. 2B is a timing diagram of the transmitter 202. The first transmitting circuit 210 transmits the first input signal TX_D1 as the first transmit signal TX_D1' for a bit time A of the transmitter clock TCLK1. In a double data rate device, the first transmitting circuit 210 transmits at both the falling and rising edges of the first transmitter clock TCLK1. The first transmit signal TX_D1' is a version of the first input signal TX_D1 synchronized with the first transmitter clock TCLK1.

The second transmitting circuit 212 transmits the second input signal TX_D2 for a bit time B of the transmitter clock TCLK2. In a double data rate device, the second transmitting circuit 212 transmits at both the falling and rising edges of the second transmitter clock TCLK2. The second transmitter signal TX_D2' is a version of the second input signal TX_D2 synchronized with the second transmitter clock TCLK2.

The node 214 superpositions the first and second transmit signals TX_D1' and TX_D2' out of phase with each other. In one embodiment, the node 214 superpositions the first and second transmit signals TX_D1' and TX_D2' 90 degrees out of phase with each other. The superposition node 214 generates the symbol data D1D2.

The symbol data D1D2 encodes various states or symbol. A symbol is a unique signal shape in a predetermined unit of time, e.g., bit times A or B. The symbol data D1D2 includes symbol sequences S2-S7-S4-S5-S3-S3-S2-S5-S2 relative to the first transmitter reference clock TCLK1 and sequences S6-S5-S6-S1-S3-S3-S6-S1-S6 relative to the second transmitter reference clock TCLK2.

Figure 3A:
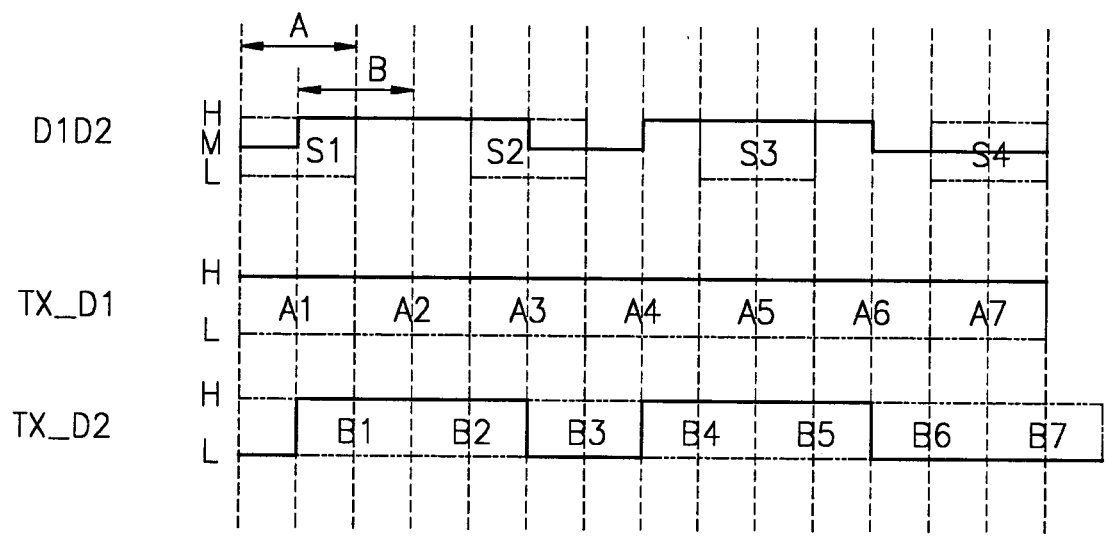
FIGS. 3A and 3B are timing diagrams of symbol definition embodiments associated with the memory interface shown in FIG. 1.
Figure 3B:
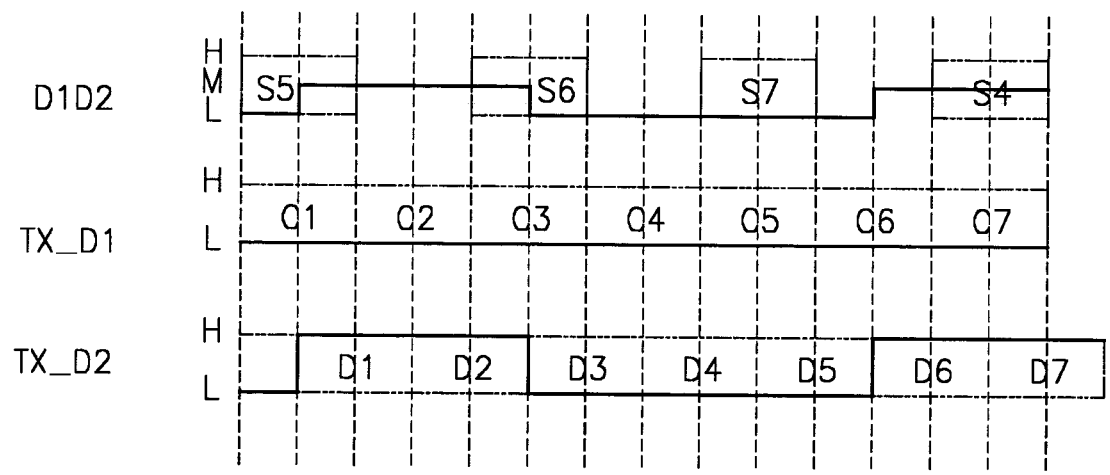

FIGS. 3A and 3B are timing diagrams of symbol definition embodiments associated with the memory interface shown in FIG. 1. Referring to FIG. 3A, the symbol data D1D2 employs two bit data. Because the symbol data D1D2 is created by the superposition of out of phase input signals, one two bit data is a full bit datum of the first input signal TX_D1 and two half bits of TX_D2 relative to bit time A. Relative to bit time B, the symbol data D1D2 includes a full bit datum of the second input signal TX_D2 and two half bits of the first input signal TX_D1.

In one embodiment, the symbol S2 is the superposition of a full bit datum A3 of TX_D1 and the second half bit of B2 and the first half bit of B3 of TX_D2. The first half bit of S2 is a logic high H resulting from the superposition of the first half bit of A3 of TX_D1 and the second half bit of B2. The second half bit of S2 is a logic medium M resulting from the superposition of the second half bit of A3 of the TX_D1 and the first half bit of B3 of TX_D2. The symbol S2, therefore, has an H and M sequence.

The symbol S3 has an H and H sequence. The symbol S5 has an L and M sequence. The symbol S6 has an M and L sequence. The symbol S7 has an L and L sequence.

All symbols have unique signal shapes corresponding to combinations of the first and second input signals TX_D1 and TX_D2 except for symbol S4. Symbol S4 has duality. In a first case, symbol S4 comprises the superposition of TX_D1's full-bit datum A7 and the second half bi of B6 and the first half bit of B7. The data A7 is a logic H and the data B6 and B7 are L. In a second case, the symbol S4 comprises the superposition of TX_D2's full-bit datum C7 and the second half bit of D6 and the first half bit of D7. The data C7 is a logic L and the data D6 and D7 are logic H. It should be apparent to a person of reasonable skill in the art that the full bit data of symbol S4 is the inversion of the half bit data. Receiver 104 will use this relationship to interpret the symbol S4.

Figure 4A:
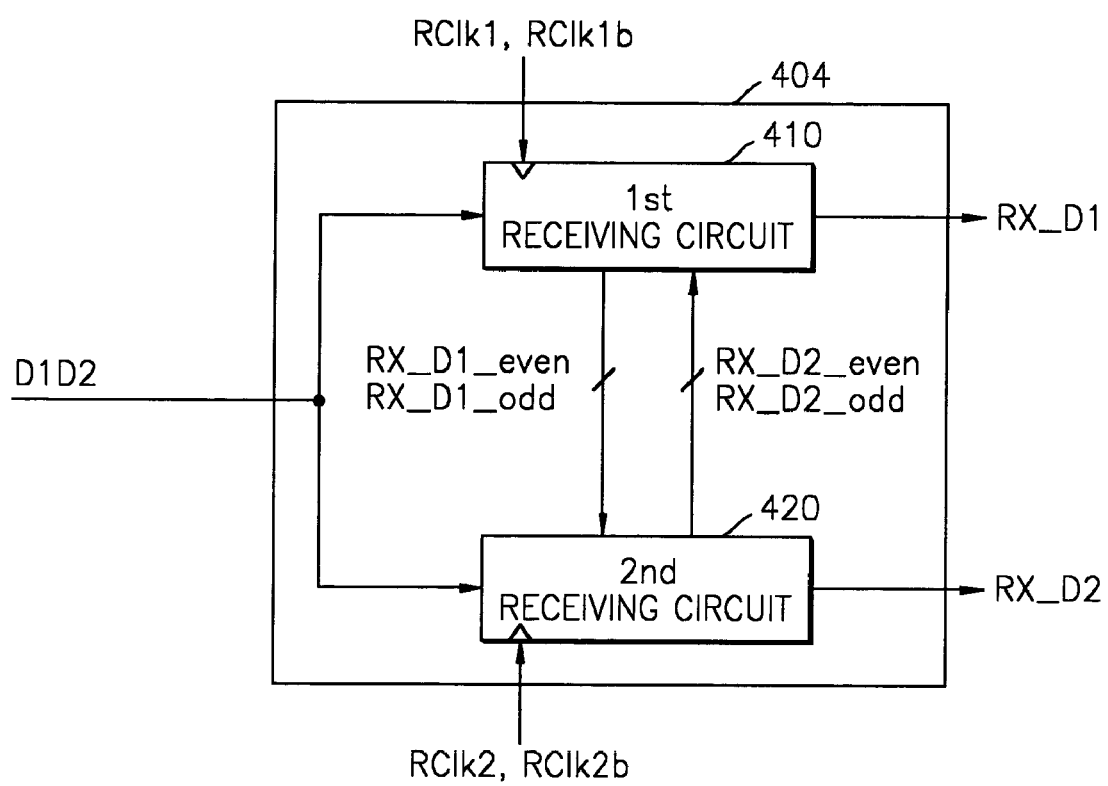
FIG. 4A is a block diagram of a receiver embodiment.

FIG. 4A is a block diagram of an embodiment of the receiver 104 shown in FIG. 1A. Referring to FIGS. 1 and 4A, the receiver 404 includes first and second receiving circuits 410 and 420, respectively. The first and second receiving circuits 410 and 420 receive the symbol data D1D2. The first receiving circuit 410 generates the signal RX_D1 by interpreting the symbol data D1D2 responsive to a first receiving clock RCLK1 and RCLK1B. Likewise, the second circuit 420 generates the signal RX_D2 by interpreting the symbol data D1D2 responsive to a second receiving clock RCLK2 and RCLK2B.

The first receiving circuit 410 generates the signals RX_D1_even and RX_D1_odd and provides them to the second receiving circuit 420. The second receiving circuit 420 generates the signals RX_D2_even and RX_D2_odd and provides them to the first receiving circuit 410.

Figure 4B:
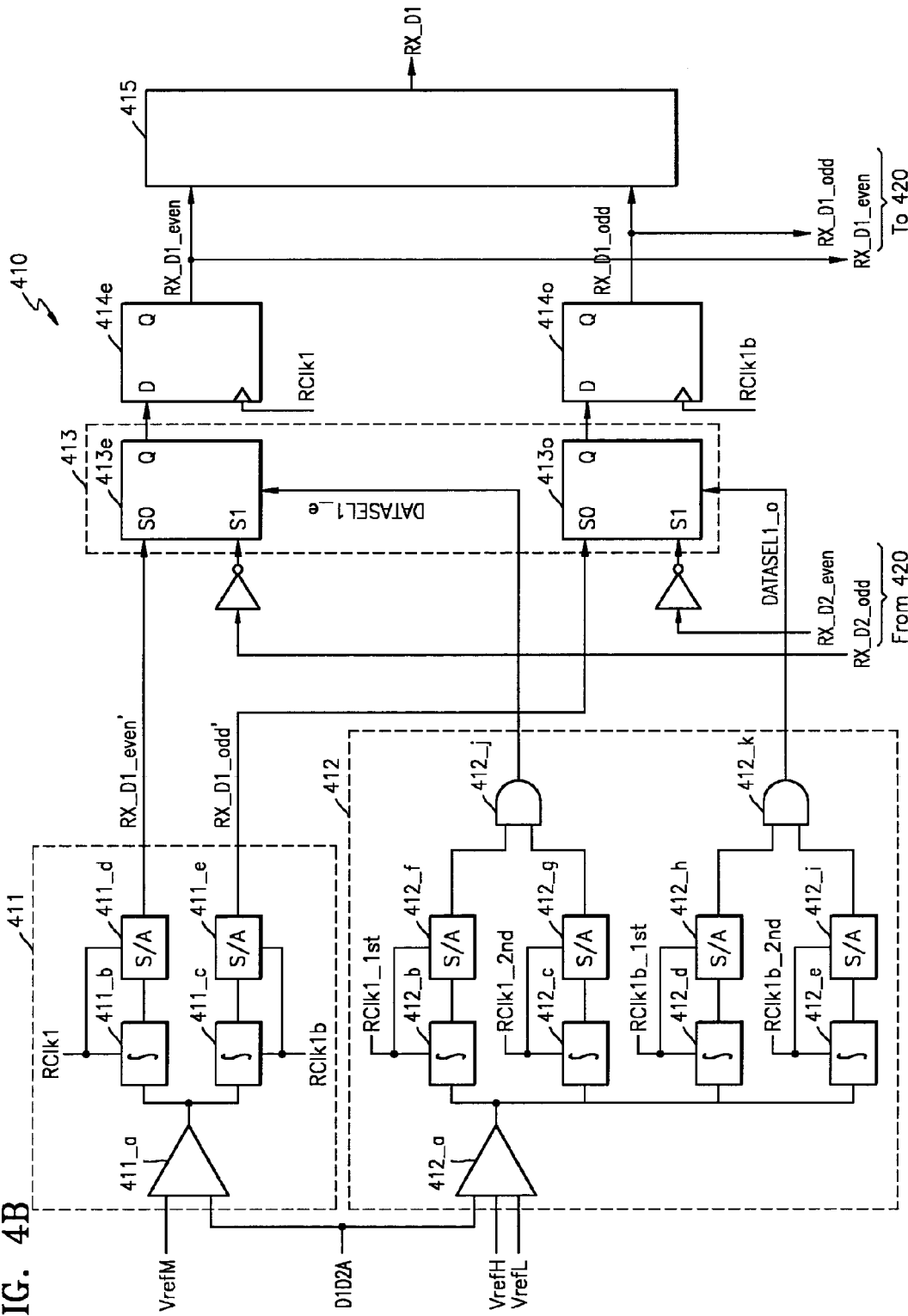
FIGS. 4B–C are block diagrams of the receiver embodiment shown in FIG. 4A.

FIG. 4B is a block diagram of the first receiving circuit 410 shown in FIG. 4A. Referring to FIGS. 4A–B, the receiver 410 includes a first detector 411 capable of generating the first even and odd data signals RX_D1_even' and RX_D1_odd', respectively, responsive to a medium reference voltage VrefM. An amplifier 411_a compares the symbol data D1D2 to the medium reference voltage VrefM, providing the results of the comparison to integrators 411_b and 411_c and sense circuits 411_d and 411_e. In one embodiment, the amplifier 411_a is a differential amplifier. The integrator 411_b and the sense circuit 411_d operate responsive to the first receiving clock RCLK1. The integrator 411_c and the sense amplifier 411_e operate responsive to a clock RCLK1b. The bit-time integrator 411_b integrates the output of the amplifier 411_a during the high level of the clock RCLK1. The sense circuit 411_d determines and maintains the output of the integrator 411_b during the low level of the clock RCLK1. Likewise, the bit-time integrator 411_c integrates the output of the amplifier 411_a during the high level of the clock RCLK1b. The sense circuit 411_e determines and maintains the output of the integrator 411_c during the low level of the clock RCLK1b. In one embodiment, clock RCLK1 is out of phase relative to clock RCLK1b by, e.g., 180 degrees, as shown in FIG. 5.

A second detector 412 is capable of generating first even and odd select signals DATASEL1_e and DATASEL0_o, respectively, responsive to high and low reference voltages VrefH and VrefL. The second detector 412 operates responsive to the clocks $RCLK1\_1^{st}$ and $RCLK1\_2^{nd}$. An amplifier 412_a compares the symbol data D1D2 to the high and low reference voltages VrefH and VrefL providing the results to integrators 412_b to 412_e and sense amplifiers 412_f to 412_i. In one embodiment, the amplifier 412_a is a folded amplifier. When the voltage level of the symbol data D1D2 is between VrefH and VrefL, the output of the pre-amplifier 412_a is a logic high. In all other cases, the output of the amplifier 412_a is a logic low. It should be apparent to a person of reasonable skill in the art that this logic can be reversed and still come within the scope of the present invention.

Figure 5:
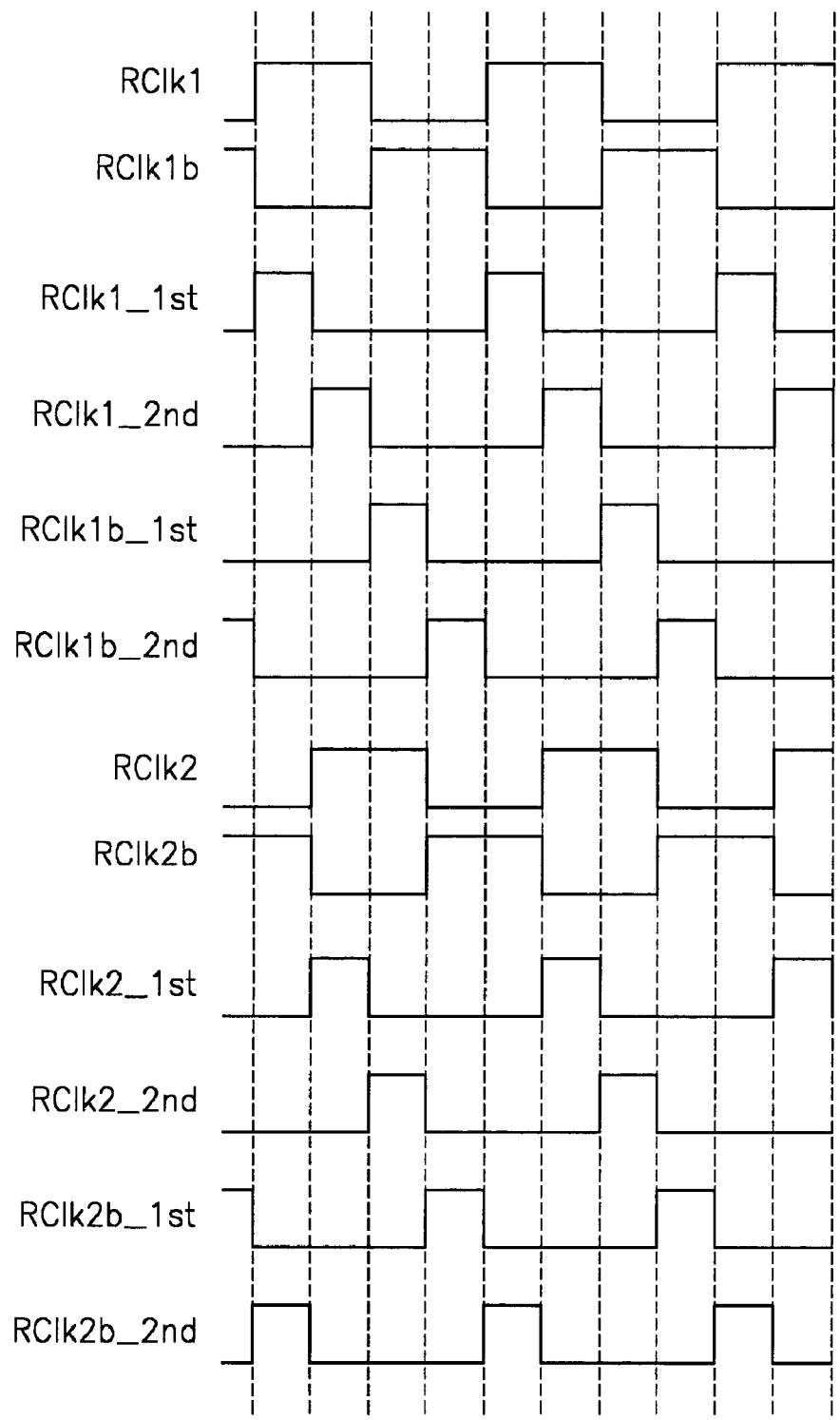
FIG. 5 is a timing diagram associated with the transmitter shown in FIGS. 4A–C.

Integrators 412_b to 412_e and sense circuits 412_f to 412_i operate responsive to clock signals $RCLK1\_1^{st}$, $RCLK1\_2^{nd}$ $RCLK1b\_1^{st}$, and $RCLK1b\_2^{nd}$, the re between them being shown in FIG. 5. In one embodiment, the integrators 412_b to 412_e are, e.g., half bit time integrators. The sense circuit 411_d determines and maintains the output of the integrator 411_b. The sense circuit 411_e determines and maintains the output of the integrator 411_c. The sense circuits 412_f and 412_g determines and maintains the output of the integrators 412_b and 412_c, respectively. The sense circuits 412_h and 412_i determines and maintains the output of the integrators 412_d and 412_e, respectively.

Logic gates 412_j and 412_k logically manipulate the output of sense amplifiers 412_f and 412_g and 412_h and 412_i, respectively, to generate the first even and odd select signals DATASEL1_e and DATASEL0_o, respectively. The signal DATASEL1_e is a logic high when the outputs of the sense circuits 412_f and 412_g are logic high. On the other hand, the signal DATASEL1_e is a logic low when the outputs of the sense circuits 412_f or 412_g are low. Likewise, the signal DATASEL1_o is a logic high when the outputs of the sense circuits 412_h and 412_i are logic high. On the other hand, the signal DATASEL1_o is a logic low when the outputs of the sense circuits 412_h or 412_i are low.

A multiplexer 413 selects between the signals RX_D1_even' and RX_D2_odd responsive to the first even select signal DATASEL1_e. And the multiplexer 413 selects between the signals RX_D1_odd' and RX_D2_even responsive to the first odd select signal DATASEL1_o.

In one embodiment, when the logic value of DATASEL1_e is high, the multiplexer 413_e selects the inverted RX_D2_odd as its output. When the logic value of DATASEL1_e is low, the multiplexer 413_e selects the RX_D1_even' as its output. In one embodiment, when the logic value of DATASEL1_o is high, the multiplexer 413_o selects the inverted RX_D2_even as its output. When the logic value of DATASEL1_o is low, the multiplexer 413_o selects the RX_D1_odd' as its output.

To achieve double data rate operation, the receiver 410 has an even and an odd data path as is evident from the above description. The even data path includes amplifiers 411_a and 412_a, integrator 411_b (full-bit), integrators 412_b and 412_c (half-bit), sense circuits 411_d, 411_f, and 411_g, and data select circuit 412_j. The odd data path includes amplifie 411_a and 412_a, integrator 411_c (full-bit), integrators 412_d and 412_e (half-bit), sense circuits 411_e, 411_h, and 411_i, and data select circuit 412_k.

The receiver 410 overlaps the following basic operations: integration and sensing and latching. For example, the integrators 411_b, 412_b, and 412_c integrate using the receiver reference clocks RClk1, RClk1_$1^{st}$, and RClk1_$2^{nd}$. Likewise, the sense and latch circuits 411_e, 412_h, and 412_i sense and latch using receiver reference clocks RClk1b, RClk1b_$1^{st}$, and RClk1b_$2^{nd}$ simultaneously.

Figure 4C:
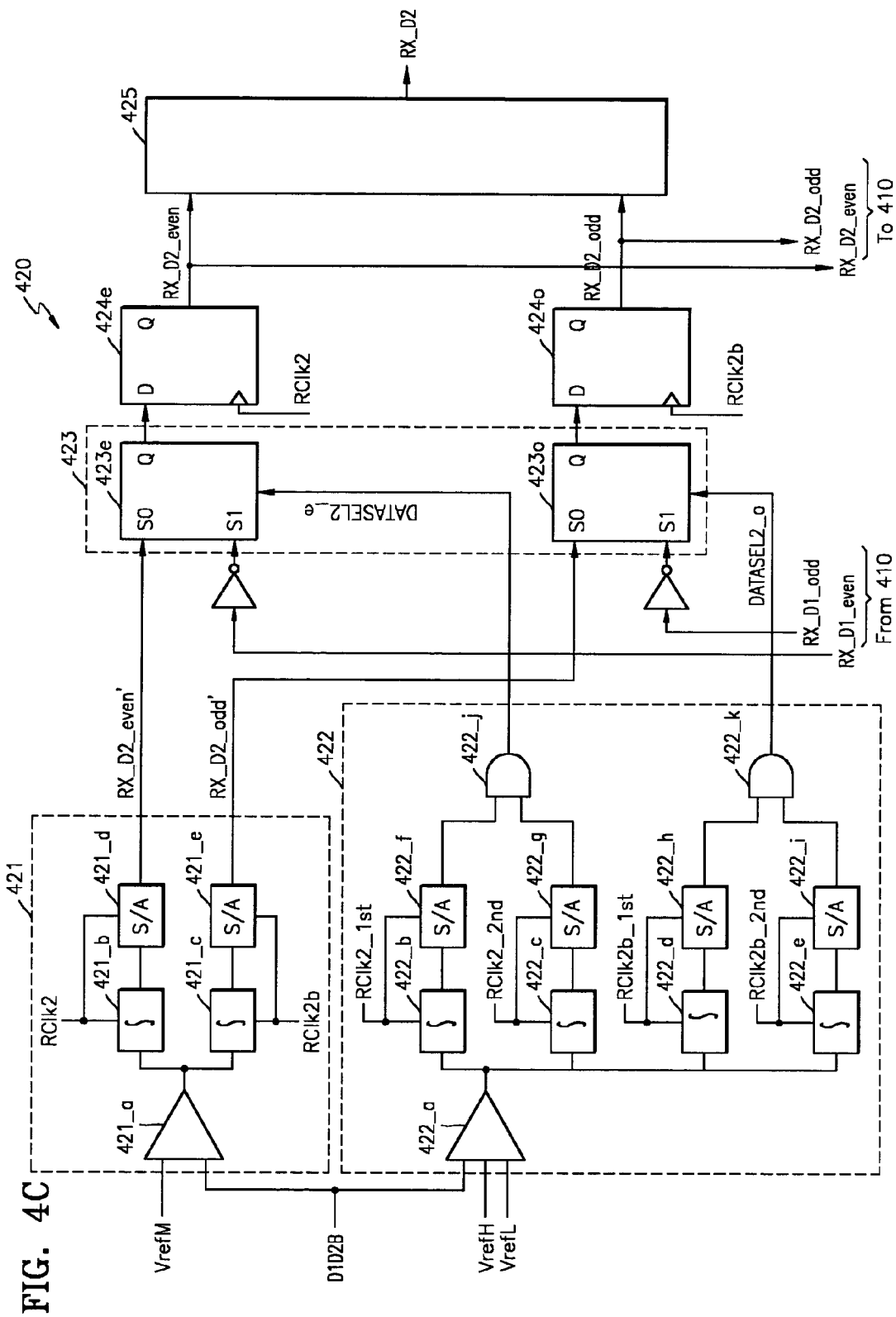

Multiplexer 415 is generating the output signal RX_D1 by receiving RX_D1_even and RX_D1_odd. FIG. 4C is a block diagram of the second receiving circuit 420 shown in FIG. 4A. We abbreviate the operating description of FIG. 4C because it is similar to FIG. 4B.

FIG. 5 is a timing diagram of the receiver reference clocks as shown in FIGS. 4A–C. Referring to FIGS. 4A–C and 5, the receiver 404 includes two kinds of reference clocks: a full bit time clock and a half bit time reference clock. In one embodiment, clocks RClk1 and RClk1b, are full bit time clocks out of phase relative to each other. In one embodiment, clocks RClk1 and RClk1b are 180 degrees out of phase. In one embodiment, clocks RClk1_1st and RClk1-$2^{nd}$ on the other hand, are half bit time clocks.

The half bit time clocks RClk1_1st and RClk1_2nd are generated from the full bit time reference clocks RClk1. In one embodiment, the bit time of the half bit reference clock RClk_1st is between 0 degrees and 90 degrees. In one embodiment, the bit time of the half bit reference clock RClk_2nd is between 90 degrees and 180 degrees.

The half bit time reference clocks RClk1b_$1^{st}$ and RClk1b-$2^{nd}$ are generated from the full bit time reference clocks RClk1b. In one embodiment, the bit time of the half bit reference clock RClk1b_$1^{st}$ is between 180 degrees and 270 degrees. In one embodiment, the bit time of the half bit reference clock RClk1b_$2^{nd}$ is between 270 degrees and 360 degrees.

The relationship between the full bit time reference clocks RClk2 and RClk2b and the half bit time reference clocks RClk2_1st, RClk2_2nd, RClk2b_$1^{st}$, and RClk2b_$2^{nd}$ similar to those described above with reference to RCLK1 and RCLK1b.

FIG. 4c is a block diagram of the second receiving circuit 420 shown in FIG. 4A. The first and second receiving circuits 410 and 420 operate similarly.

Figure 6:
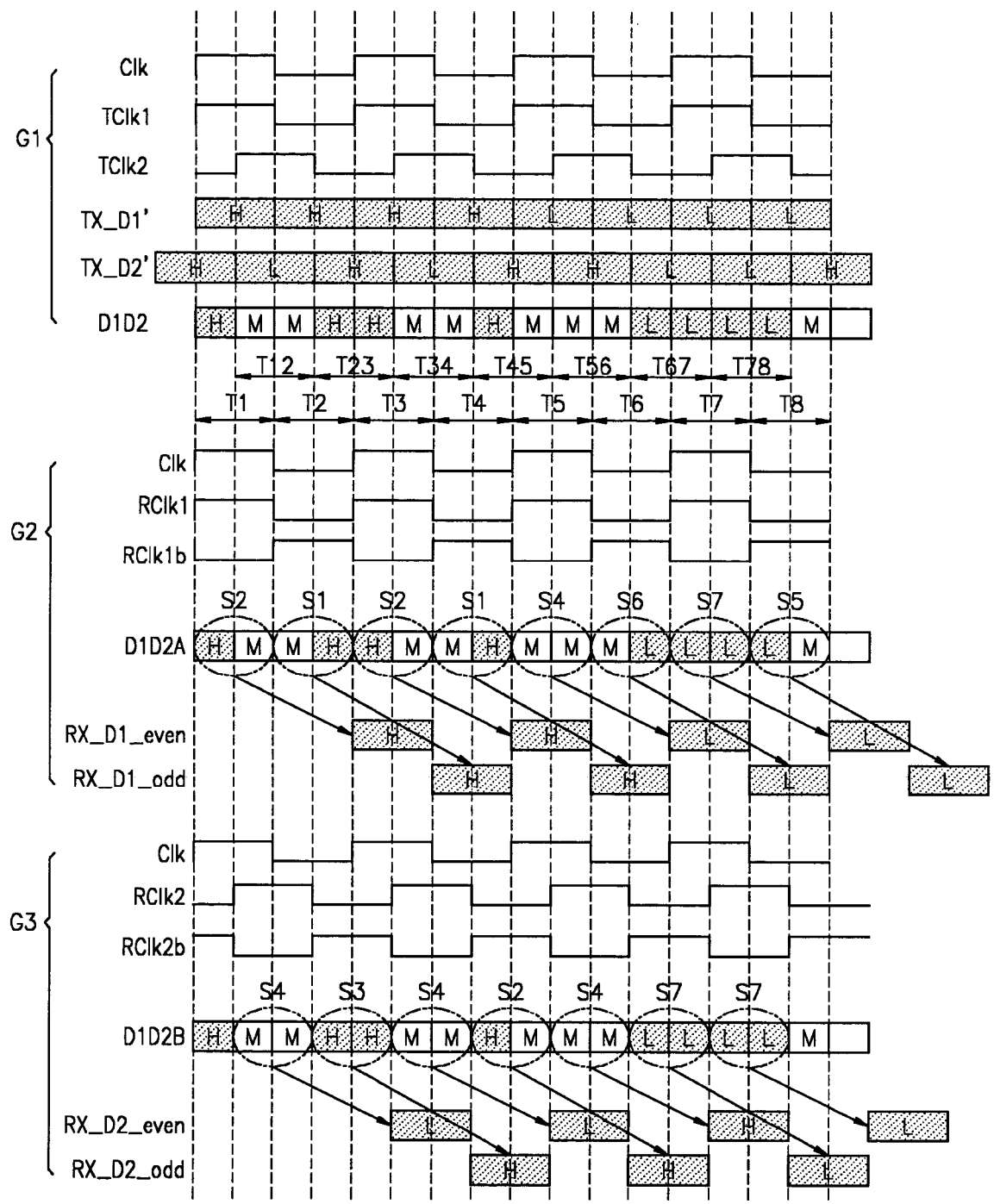
FIG. 6 is a timing diagram associated with the invention embodiment shown in FIG. 1.

FIG. 6 is a timing diagram of the operation of the circuit 100 shown in FIGS. 1–6. Referring to FIGS. 1–6, the portion of the diagram marked G1 corresponds to timing associated with the transmitter 102 (202 in FIG. 2A). The symbol data D1D2 is provided to the receiver 104 by the transmitter 102.

The G2 portion corresponds to timing associated with the receiving circuit 410 and the G3 portion corresponds to timing associated with the second receiving circuit 420. The inbound symbol data D1D2 is received by the receiving circuits 410 and 420 as, e.g., D1D2A and D1D2B. The timeslice T1 to T8 represents a full bit time relative to clocks RClk1 and RClk1b. Each symbol includes a full bit datum of TX_D1' and two half bit data of TX_D2'.

In the example of T3 of G2, the first receiving circuit 410 receives a symbol S2 of the symbol data D1D2A. The symbol S2 is one full bit datum of TX_D1' logic value high and two half bit data of TX_D2' logic value low and logic value high. The first receiving circuit 410 interprets the symbol S2 as one full bit datum of RX_D1_even' according to the RClk1, RClk1_$1^{st}$, and RClk1_2nd.

In the example of T45 of G3, the second receiving circuit 420 receives a symbol S2 of the symbol data D1D2B. The symbol S2 is one full bit datum of TX_D2' logic value high and two half bit data of TX_D1' logic value high and logic value low. The second receiving circuit 420 interprets the symbol S2 as one full bit datum of RX_D2_odd' according to the clocks RClk2b, RClk2b_{13} $1^{st}$, and RClk2b_2nd.

In the example of T5 of G2, the first receiving circuit 410 receives a symbol S4 of the symbol data D1D2A. The symbol S4 is one full bit datum of TX_D1' logic value low and two half bit data of TX_D2' logic value high and logic value high. The first receiving circuit 410 interprets the symbol S4 as one full bit datum of RX_D1_even' according to the RClk1, RClk1_$1^{st}$, and RClk1_2nd.

Figure 7:
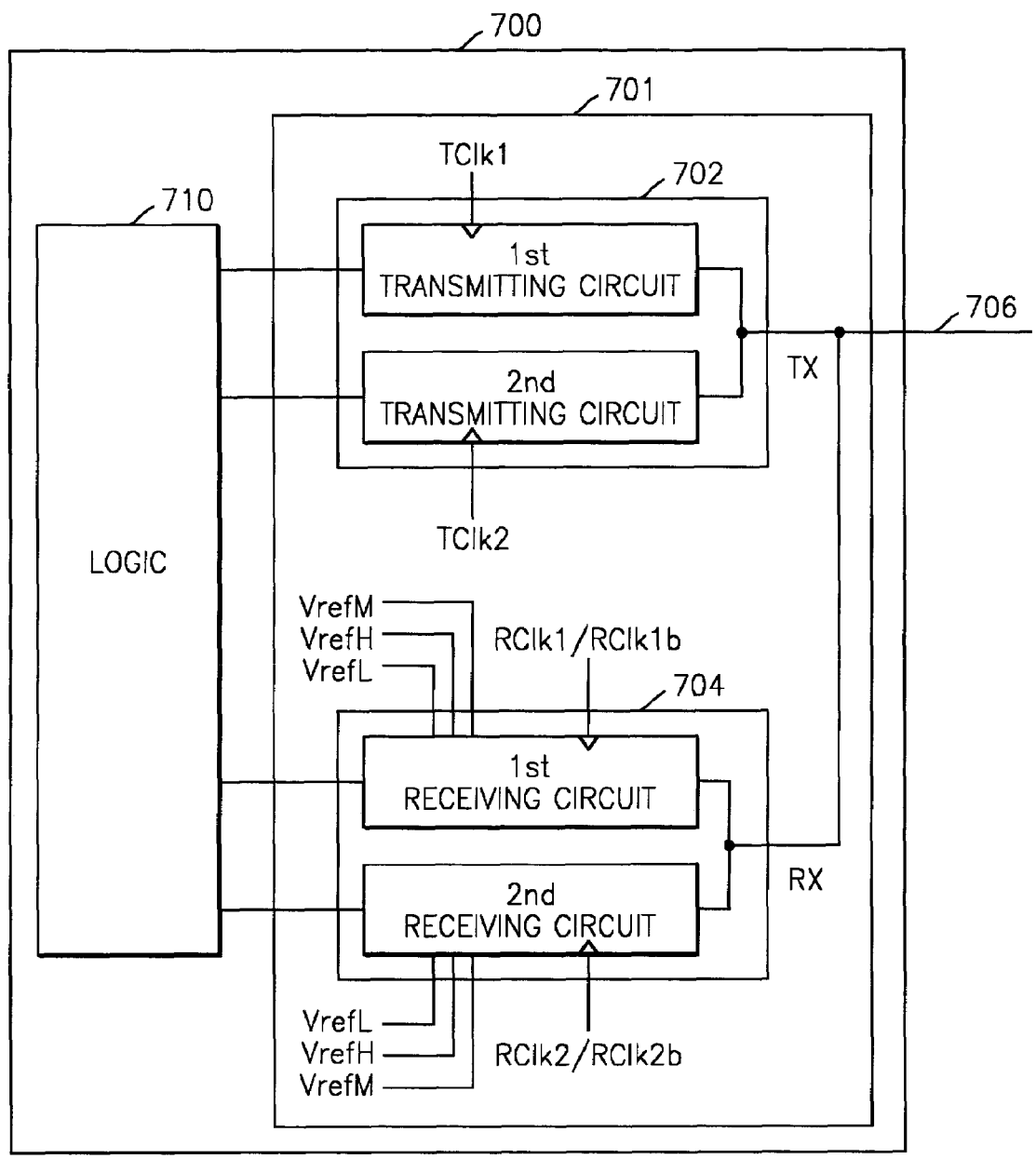
FIG. 7 is a block diagram of an invention embodiment.

FIG. 7 is a block diagram of a data transceiver equipped with an embodiment of the present invention. Referring to FIG. 7, a semiconductor device 700 might be, e.g., a microprocessor, controller, memory device, or any other semiconductor device. The semiconductor device 700 comprises a data transceiver 701 capable of receiving and transmitting signals. The data transceiver includes a transmitter 702 and a receiver 704 commonly connected to a transmission line 706.

Figure 8:
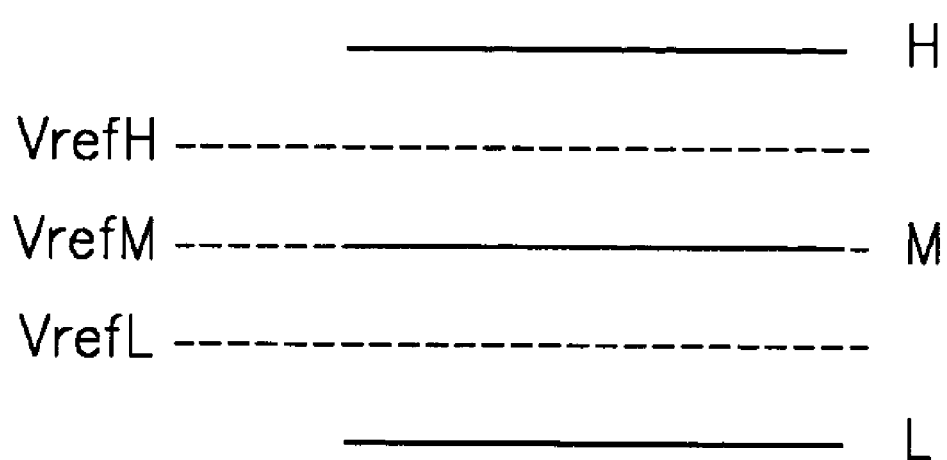
FIG. 8 is a diagram of the reference voltage associated with the receiver embodiment shown in FIGS. 4A–C.

FIG. 8 is a voltage level of the signals used in receiver 104 as we explained in more detail above.

Having illustrated and described the principles of our invention(s), it should be readily apparent to those skilled in the art that the invention(s) can be modified in arrangement and detail without departing from such principles. We claim all modifications coming within the spirit and scope of the accompanying claims.

We claim:

1. A semiconductor device comprising:
  a transmitter capable of encoding first and second input signals as a plural-bit symbol signal responsive to first and second clocks, respectively, the first clock being out of phase from the second clock; and
  a receiver capable of generating first and second output signals by decoding the symbol signal responsive to third and fourth clocks, respectively, and capable of generating first and second even and odd data;
  where the receiver comprises:
    a first receiving circuit capable of generating the first output signal by manipulating the symbol signal responsive to the third and a fifth clocks, the fifth clock being out of phase from the third clock, the first receiving circuit being adapted to generate the first even and odd data responsive to the third and fifth clocks, respectively; and
   a second receiving circuit capable of generating the second output signal by manipulating the symbol signal responsive to the fourth and a sixth clocks, the sixth clock being out of phase from the fourth clock, the second receiving circuit being adapted to generate the second even and odd data responsive to the fourth and sixth clocks, respectively; and
where the first receiving circuit comprises:
   a first detector capable of generating the first even and odd data according to a medium reference voltage;
   a second detector capable of generating first select signal by detecting midlevel data according to high and low reference voltages; and
   a multiplexer capable of selecting between the first even and the second odd data and the first odd and the second even data responsive to the select signal.

2. The semiconductor device of claim 1 where the plural-bit symbol signal is at least two bit data.

3. The semiconductor device of claim 1 where the at least two bit data is a three level data.

4. The semiconductor device of claim 1 where the three level data includes a first, second, and third levels.

5. The semiconductor device of claim 1 where the at least two bit data is a four level data.

6. The semiconductor device of claim 1 where the four level data includes a first, second, third, and fourth levels.

7. The semiconductor device of claim 1 where the second clock is 90 degrees out of phase from the first clock.

8. The semiconductor device of claim 1 where the fourth clock is 90 degrees out of phase from the third clock.

9. The semiconductor device of claim 1 where the symbol signal comprises a plurality of symbols.

10. The semiconductor device of claim 1 where the transmitter comprises:
   a first transmitting circuit capable of generating a first transmitting signal by manipulating the first input signal responsive to the first clock;
   a second transmitting circuit capable of generating a second transmitting signal by manipulating the second input signal responsive to the second clock; and
   a superposition node capable of generating the symbol signal by super-positioning the first and second transmitting signals.

11. The semiconductor device of claim 1 where the fifth clock is 180 degrees out of phase from the third clock; and where the sixth clock is 180 degrees out of phase from the fourth clock.

12. A semiconductor device comprising:
   a transmitter capable of encoding first and second input signals as a plural-bit symbol signal responsive to first and second clocks, respectively, the first clock being out of phase from the second clock; and
   a receiver capable of generating first and second output signals by deciding the symbol signal responsive to third and fourth clocks, respectively, and capable of generating first and second even and odd data;
where the receiver comprises:
   a first receiving circuit capable of generating the first output signal by manipulating the symbol signal responsive to the third and a fifth clocks, the fifth clock being out of phase from the third clock, the first receiving circuit being adapted to generate the first even and odd data responsive to the third and fifth clocks, respectively; and
   a second receiving circuit capable of generating the second output signal by manipulating the symbol signal responsive to the fourth and a sixth clocks, the sixth clock being out of phase from the fourth clock, the second receiving circuit being adapted to generate the second even and odd data responsive to the fourth and sixth clocks, respectively; and
where the second receiving circuit comprises:
   a first detector capable of generating the second even and odd data according to a medium reference voltage;
   a second detector capable of generating a select signal by detecting midlevel data according to high and low reference voltages; and
   a multiplexer capable of selecting between the first and second even data and the first and second odd data responsive to the select signal.

13. A device, comprising:
transmitting means capable of encoding input data as plural-bit symbol data responsive to at least two transmitting clocks out of phase from each other; and
receiving means capable of generating output data and first and second even and odd data by decoding the symbol data responsive to at least two receiving clocks;
where the receiving means comprises:
   first receiving circuit means capable of generating first output data by manipulating the symbol data responsive to one of the at least two receiving clocks: and
   second receiving circuit means capable of generating second output data by manipulating the symbol data responsive to another of the at least two receiving clocks;
where the first receiving circuit means comprises:
   first detecting means capable of generating first pre even and pre odd data according to a medium reference voltage;
   second detecting means capable of generating the first odd and even select signals by detecting midlevel data according to high and low reference voltages; and
   first multiplexing means capable of selecting between the first pre even and pre odd data and second even and odd data responsive to the first odd and even select signals, respectively.

14. The device of claim 13 where the plural-bit symbol data is at least two bit data.

15. The device of claim 13 where the at least two transmitting clocks are 90 degrees out of phase from each other.

16. The device of claim 13 where the at least two receiving clocks are 90 degrees out of phase from each other.

17. The device of claim 13 where the transmitting means comprises:
   first transmitting circuit means capable of generating a first transmitting signal by manipulating the input data responsive to one of the at least two transmitting clocks;
   second transmitting circuit means capable of generating a second transmitting signal by manipulating the input data responsive to another of the at least two transmitting clocks; and
   superposition means capable of generating the symbol data by super-positioning the first and second transmitting signals.

18. The device of claim 13, further comprising:
first generating means generating first even and odd data responsive to one of the receiving clocks.

19. The device of claim 18 where the second receiving circuit means comprises:
third detecting means capable of generating second pre even and pre odd data according to the medium reference voltage;
fourth detecting means capable of generating second odd and even select signals by detecting midlevel data according to the high and low reference voltages; and
second multiplexing means capable of selecting between the second pre even and pre odd data and first even and odd data responsive to the second odd and even select signals, respectively.

20. The device of claim 19, further comprising:
second generating means generating second even and odd data responsive to the other of the receiving clocks.

21. A receiver, comprising:
a first receiving circuit capable of generating first output data and first even and odd data by manipulating symbol data responsive to a first and second clocks, the first output data being single bit data, the symbol data being plural-bit data, the first receiving circuit being capable of receiving the second even and odd data; and
a second receiving circuit capable of generating second output data and second even and odd data by manipulating the symbol data responsive to a third and fourth clocks, the second output data being single bit data, the second receiving circuit being capable of receiving the first even and odd data;
where the second clock is out of phase from the first clock and the fourth clock is out of phase from the third clock; and
where the first receiving circuit comprises:
a first detector capable of generating first pre odd and pre even data responsive to a medium reference voltage;
a second detector capable of generating first odd and even select signals by detecting midlevel data responsive to high and low reference voltages; and
a multiplexer capable of selecting between the first pre even data and the second odd data responsive to the first even select signal and between the first pre odd data and the second even data responsive to the first odd select signal.

22. The receiver of claim 21
where the first receiver is capable of receiving the second even and odd data; and
where the second receiver is capable of receiving the first even and odd data.

23. The receiver of claim 21
where the second detector is capable of operating responsive to a plurality of first and a plurality of second phase clocks derived from the first and second clocks, respectively, the first phase clocks having a different duty cycle than the first clocks and the second phase clocks having a different duty cycle than the second clocks.

24. The receiver of claim 21 where the second receiving circuit comprises:
a third detector capable of generating second pre odd and pre even data responsive to the medium reference voltage;
a fourth detector capable of generating second odd and even select signals by detecting midlevel data responsive to the high and low reference voltages; and
a multiplexer capable of selecting between the second pre even data and the first even data responsive to the second even select signal and between the second pre odd data and the first odd data responsive to the second odd select signal.

25. The receiver of claim 24
where the fourth detector is capable of operating responsive to a plurality of third and a plurality of fourth phase clocks derived from the third and fourth clocks, respectively, the third phase clocks having a different duty cycle than the third clocks and the fourth phase clocks having a different duty cycle than the fourth clocks.

* * * * *

UNITED STATES PATENT AND TRADEMARK OFFICE
CERTIFICATE OF CORRECTION

PATENT NO. : 7,030,655 B2  Page 1 of 1
APPLICATION NO. : 10/645922
DATED : April 18, 2006
INVENTOR(S) : Choi It is certified that error appears in the above-identified patent and that said Letters Patent is hereby corrected as shown below:

At column 4, line 47, please replace "RCLK1-2nd" with --RCLK1_2nd--;
At column 4, line 47, please replace "re" with --relationship--;
At column 6, line 30, please replace "RCLK2b 13 1st" with --RCLKb_1st--;
At column 8, line 30, please replace "clocks:" with --clocks;--.

Signed and Sealed this

Tenth Day of July, 2007

JON W. DUDAS
*Director of the United States Patent and Trademark Office*